United States Patent
Abdeddaim et al.

(10) Patent No.: US 10,684,332 B2
(45) Date of Patent: Jun. 16, 2020

(54) RADIO-FREQUENCY ANTENNA SYSTEM BASED ON MODE HYBRIDISATION FOR A NUCLEAR MAGNETIC RESONANCE DEVICE

(71) Applicant: Centre National de La Recherche Scientifique—CNRS, Paris (FR)

(72) Inventors: Mohamed Redha Abdeddaim, Marseilles (FR); Camille Jouvaud, Paris (FR); Benoit Larrat, Paris (FR); Julien Derosny, Nogent sur Marne (FR); Mickael Tanter, Bagneux (FR); Mathias Fink, Meudon (FR)

(73) Assignee: Centre National De La Recherche Scientifique—CNRS, Paris (FR)

( * ) Notice: Subject to any disclaimer, the term of this patent is extended or adjusted under 35 U.S.C. 154(b) by 423 days.

(21) Appl. No.: 15/022,393

(22) PCT Filed: Sep. 12, 2014

(86) PCT No.: PCT/FR2014/052272
§ 371 (c)(1),
(2) Date: Mar. 16, 2016

(87) PCT Pub. No.: WO2015/044554
PCT Pub. Date: Apr. 2, 2015

(65) Prior Publication Data
US 2016/0223630 A1    Aug. 4, 2016

(30) Foreign Application Priority Data
Sep. 27, 2013    (FR) .................... 13 59369

(51) Int. Cl.
*G01R 33/34* (2006.01)
*G01R 33/36* (2006.01)
*G01R 33/3415* (2006.01)

(52) U.S. Cl.
CPC ... *G01R 33/34046* (2013.01); *G01R 33/3415* (2013.01); *G01R 33/34092* (2013.01); *G01R 33/3642* (2013.01); *G01R 33/3628* (2013.01)

(58) Field of Classification Search
CPC ........ G01R 33/34046; G01R 33/34092; G01R 33/3415; G01R 33/3628; G01R 33/3642;
(Continued)

(56) References Cited

U.S. PATENT DOCUMENTS 4,757,290 A * 7/1988 Keren ............ G01R 33/34046
324/318
5,998,999 A    12/1999 Richard
(Continued)

FOREIGN PATENT DOCUMENTS

FR    2 681 432 A1    3/1993

OTHER PUBLICATIONS

International Search Report Application No. PCT/FR2014/052272 dated Feb. 18, 2015.
(Continued)

*Primary Examiner* — Hoai-An D. Nguyen
(74) *Attorney, Agent, or Firm* — Miller, Matthias & Hull LLP

(57) ABSTRACT

The invention relates to a radio-frequency antenna system including at least one radio-frequency transmitter and/or receiver and resonators which are mutually electro-magnetically hybridised, coupled with the radio-frequency transmitter and/or receiver, and electrically insulated from one another and from the radio-frequency transmitter and/or receiver.

15 Claims, 8 Drawing Sheets

(58) Field of Classification Search
CPC ........ G01R 33/00; G01R 33/20; G01R 33/28; G01R 33/32; G01R 33/34; G01R 33/341; G01R 33/36
USPC .......................................... 324/300, 318, 322
See application file for complete search history.

(56) References Cited

U.S. PATENT DOCUMENTS

2007/0279149 A1* 12/2007 Dal Molin ......... A61N 1/37223
  333/133
2008/0284436 A1  11/2008 Weizenecker
2017/0285118 A1* 10/2017 Kim .................... A61B 5/055

OTHER PUBLICATIONS

French Search Report Application No. FR 13 9369 dated Jul. 8, 2014.
Alexander Novikov: "Advanced theory of driven birdcage resonator with losses for biomedical magnetic resonance imaging and spectroscopy", Magnetic Resonance Imaging Elsevier Science, Tarrytown, NY, US, vol. 29, No. 2, Aug. 1, 2010 (Aug. 1, 2010), pp. 260-271, XP028138164, ISSN: 0730-725X, DOI: 10.1016/J.MRI.2010.08.001 [extrait le Aug. 6, 2010] le document en entier.
Stuart Crozier et al: "Incorporating phase retardation effects into radiofrequency resonator models: application to magnetic resonance microscopy", Measurement Science and Technology, I0P, Bristol, GB, vol. 11, No. 3, Mar. 1, 2000 (Mar. 1, 2000), pp. 221-226, XP020062881, ISSN: 0957-0233, DOI: 10.1088/0957-0233/11/3/308 le document en entier.

* cited by examiner

RADIO-FREQUENCY ANTENNA SYSTEM BASED ON MODE HYBRIDISATION FOR A NUCLEAR MAGNETIC RESONANCE DEVICE

CROSS-REFERENCE TO RELATED APPLICATION

This Application is a 35 USC § 371 US National Stage filing of International Application No. PCT/FR2014/052272 filed on Sep. 12, 2014, and claims priority under the Paris Convention to French Patent Application No. 13 59369 filed on Sep. 27, 2013.

FIELD OF THE DISCLOSURE

The present invention relates to radio-frequency antenna systems, particularly for imaging and spectroscopy by nuclear magnetic resonance, and to devices comprising such systems.

BACKGROUND OF THE DISCLOSURE

More particularly, the invention relates to a radio-frequency antenna system comprising at least one radio-frequency transmitter and/or receiver connected to a transmission and/or reception control device adapted to cause said radio-frequency antenna to transmit and/or receive radio-frequency waves at a radio frequency $\omega 0$ within a given volume, and mutually hybridized resonators having a resonance frequency $\omega'$ close to $\omega 0$, which are mutually hybridized electromagnetically, coupled to the radio-frequency transmitter and/or receiver and electrically insulated from one another and from the radio-frequency transmitter and/or receiver.

The "birdcage" as described in the document of Cecil E. Hayes entitled "The development of the birdcage resonator: a historical perspective" is an example of such a radio-frequency antenna system comprising a system of resonators mutually connected by passive components and to the radio-frequency transmitter and/or receiver. There is an even number of uniformly spaced rods. The signal-to-noise ratio of the MRI imaging device is increased in comparison to a simple antenna such as a loop, the penetration depth is greater, and the imaging region is increased longitudinally.

In such a radio-frequency antenna system, the connection between the rods forms a cumbersome obstruction around the imaged object. In addition, the magnetic field generated by such a radio-frequency antenna system is not perfectly homogeneous, particularly at high magnetic fields greater than or equal to 3 T.

The present invention is intended to overcome these disadvantages.

SUMMARY OF THE DISCLOSURE

According to the invention, a radio-frequency antenna system for a nuclear magnetic resonance device is characterized in that the resonators are mutually hybridized electromagnetically, are coupled to the radio-frequency transmitter and/or receiver, and are electrically insulated from one another and from the radio-frequency transmitter and/or receiver.

With these arrangements, there is less obstruction around the subject, facilitating the use of the nuclear magnetic resonance device. The magnetic field is made potentially more homogeneous by mode hybridization, particularly at high fields greater than or equal to 3 T.

Among the other advantages of the invention, the radio-frequency antenna system can be tuned or detuned mechanically, in particular by modifying the geometry and arrangement of the electromagnetically hybridized resonators.

In preferred embodiments of the antenna system of the invention, one or more of the following arrangements may possibly be used:

the resonators are N in number and have N hybridized modes, the radio-frequency antenna system further comprising mode excitation means for selectively exciting said hybridized modes;

said mode excitation means are adapted to excite a plurality of hybridized modes simultaneously;

the resonators comprise resonators that have at least one resonance primarily excited by the electric field;

the resonators that have at least one resonance primarily excited by the electric field are parallel resonant rods arranged around the given volume and made of a non-magnetic material that is electrically conductive;

the rods are arranged at an equal distance from a central axis;

the radio-frequency transmitter and/or receiver comprises a radio-frequency antenna selected from among a loop and an electric dipole which is not adapted;

the radio-frequency transmitter and/or receiver comprises a plurality of radio-frequency antennas;

the system further comprises a solid dielectric element of high index placed at least partially between the resonators;

the resonators have an adjustable length, further comprising at least one internal device for adjusting the length of the rods, the resonance frequency of the resonators being a function of said length; the system further comprises a device for moving the resonators relative to one another, the frequency of the hybridized modes being a function of the relative positions of said resonators;

the distance between the resonators is between $\lambda'/30$ and $\lambda'/3$ where $\lambda'$ is the wavelength associated with the pulse $\omega'$.

The invention also relates to a nuclear magnetic resonance device comprising at least:

an electromagnet adapted to generate a permanent magnetic field, a radio-frequency antenna system as described above, adapted to generate a radio-frequency magnetic field having at least one component transverse to the permanent magnetic field.

In preferred embodiments of the nuclear magnetic resonance device according to the invention, one or more of the following arrangements may possibly be used:

the device further comprises a non-resonant passive conductive member adapted to render the radio-frequency magnetic field more homogeneous;

the imaging device further comprises a coil system adapted to create magnetic field gradients in addition to the permanent magnetic field;

the permanent magnetic field is greater than or equal to 3 T;

Other features and advantages of the invention will become apparent from the following description of several of its embodiments, given by way of non-limiting example, with regard to the accompanying drawings.

DETAILED DESCRIPTION OF THE DISCLOSURE

In the various figures, the same references designate identical or similar elements.

Figure 1:
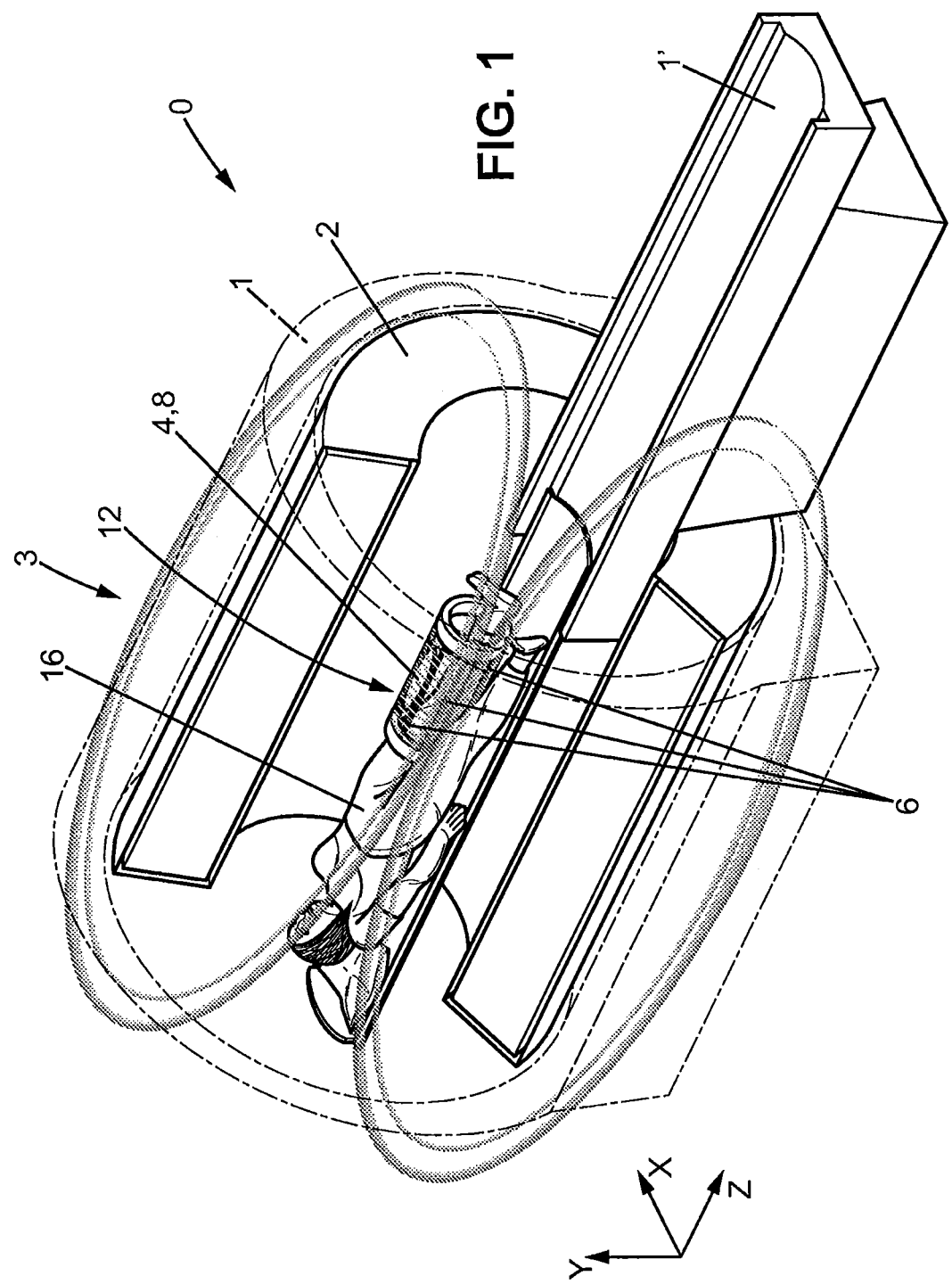
FIG. 1 is a schematic diagram of an MRI imaging device comprising a radio-frequency antenna system according to one embodiment of the invention.

FIG. 1 shows a nuclear magnetic resonance device 0, comprising an electromagnet 2 which generates a permanent magnetic field B0. In the following description, a horizontal axis in a space as shown in FIG. 1 is denoted z, x is a horizontal axis perpendicular to the z axis, and y is a vertical axis. The lines of the permanent magnetic field B0 generated by the electromagnet 2 loop between the interior and exterior of the electromagnet 2 as shown in FIG. 1, and the field within the walls of the electromagnet 2 is along said z axis.

The nuclear magnetic resonance device 0 also comprises a radio-frequency antenna device. The radio-frequency antenna device comprises a radio-frequency antenna system 3 generating radio-frequency magnetic field waves B1 via a radio-frequency transmitter 4, at frequency $\omega 0$, referred to as the Larmor frequency of the magnetic moments of the nuclei of interest as defined in the next paragraph, which is the working frequency of the radio-frequency antenna device. These waves are generated within a system of resonators 6, the field B1 being transverse to the permanent magnetic field B0. The radio-frequency antenna system 3 also comprises a radio-frequency receiver 8. In a variant, the radio-frequency antenna device may be used within the nuclear magnetic resonance device only for transmission or reception. In another variant, the radio-frequency transmitter 4 and the radio-frequency receiver 8 may be a single element. The radio-frequency antenna system 3 includes electronics which will be described in the following description and which are connected to a central processing unit to form the radio-frequency antenna device.

In proportion to an MRI device, as represented in FIG. 1, the radio-frequency antenna system integrated within the MRI device will have a size of 30 cm for example for an MRI enclosure one meter in diameter, or more generally the radio-frequency antenna system can have a size of about one third the size of the nuclear magnetic resonance device.

The general principle of the nuclear magnetic resonance device 0, based on the principles of nuclear magnetic resonance, is to first magnetize the tissues by aligning the magnetic moments of the nuclei with the permanent magnetic field B0 emitted by the electromagnet 2. The radio-frequency magnetic field B1 starts precessing the magnetic moments of the nuclei at said Larmor frequency $\omega 0$. This Larmor frequency is determined by the permanent magnetic field B0 of the electromagnet. It is defined by the relationship: $\omega 0 = \gamma \cdot B0$, $\gamma$ being the gyromagnetic ratio of the nucleus. The dynamics of the return to equilibrium of the magnetic moments of the nuclei are recorded. They depend on the nature of the biological tissues analyzed. This general principle is well known in itself and will not be described in more detail here.

The nuclear magnetic resonance device 0 also comprises a helium cooling system 1 and a system 1' for introducing the patient into the enclosure defined by the electromagnet 2.

The nuclear magnetic resonance device may be used for NMR spectroscopy or for MRI imaging.

In the second case, the nuclear magnetic resonance device 0 also comprises a coil system 12 as represented in FIG. 1, which creates magnetic field gradients in addition to the permanent magnetic field, used to locate the imaged slice. The magnetic field gradients generated by the coil system 12 are used to induce slightly different precession frequencies according to the position of the nuclei in these gradients.

The permanent magnetic field B0 has, for example, a value between 1 T and 20 T. For a nuclear magnetic resonance device 0 operating at 1.5 T, the Larmor frequency is typically 63 MHz for the moment of hydrogen nuclei. For a nuclear magnetic resonance device 0 operating at 9.4 T, the Larmor frequency is typically 400 MHz and the nuclear magnetic resonance device 0 can climb for example to 17 T for the working field in animals, which corresponds to a Larmor frequency of 730 MHz. The nuclear magnetic resonance device 0 can work at magnetic fields generally ranging from 3 T to 30 T. In a preferred embodiment, the permanent magnetic field B0 is greater than or equal to 3 T.

The radio-frequency transmitter 4 and/or receiver 8 is connected to a transmission 9 and/or reception 9' electronic control unit, comprising radio-frequency signal generators, amplifiers, and for example an electrical connection to a power source. The control device is adapted to cause said radio-frequency transmitter 4 and/or receiver 8 to transmit and/or receive radio-frequency waves B1 at radio frequency $\omega 0$ within a given volume 13, in the plane (x,y) for example, the orientation of the permanent magnetic field B0 being along the z axis.

An electronic system for impedance matching 28 allows adapting the resonance frequency of the radio-frequency antenna system 3 to said Larmor frequency $\omega 0$ of the element to be imaged. An electrical matching circuit 30 present on the power to the radio-frequency receiver 8, comprising passive components such as capacitors of non-magnetic material, allows adapting the frequency of the radio-frequency waves to the reception control device 9'.

Figure 2:
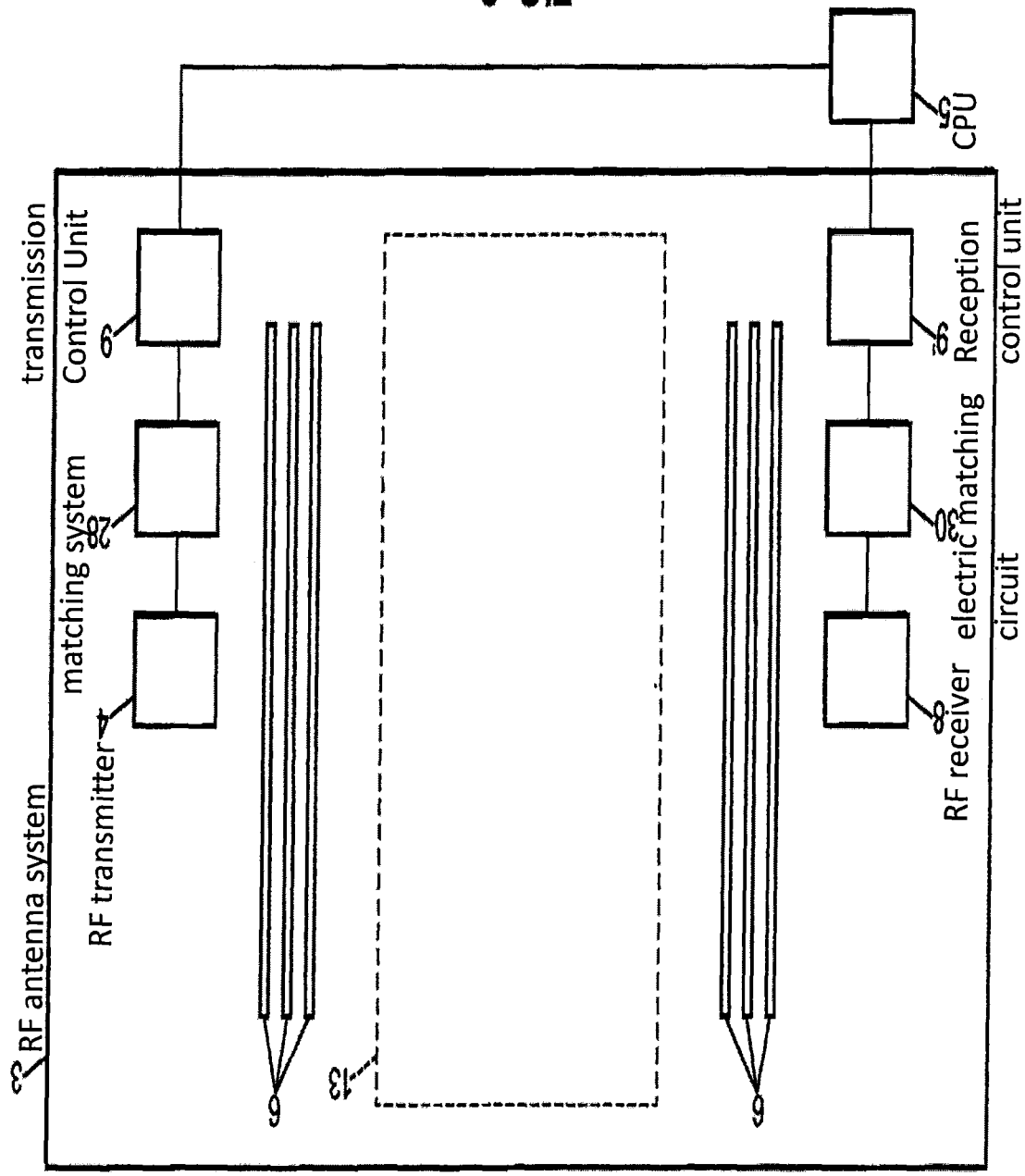
FIG. 2 is a block diagram of the radio-frequency antenna device according to an embodiment of the invention.

The assembly of radio-frequency transmitter 4, matching system 28, and transmission 9 and/or reception 9' control device, constitutes the input of the radio-frequency antenna system 3. The radio-frequency receiver 8, the electric matching circuit 30, and the reception control device 9' constitute the output of the radio-frequency antenna system 3. This input and output, with the system of resonators 6, constitute the radio-frequency antenna system 3. The radio-frequency antenna device is formed of this radio-frequency antenna system 3, as well as a central processing unit 5. This device is represented by a block diagram in FIG. 2.

Figure 3:
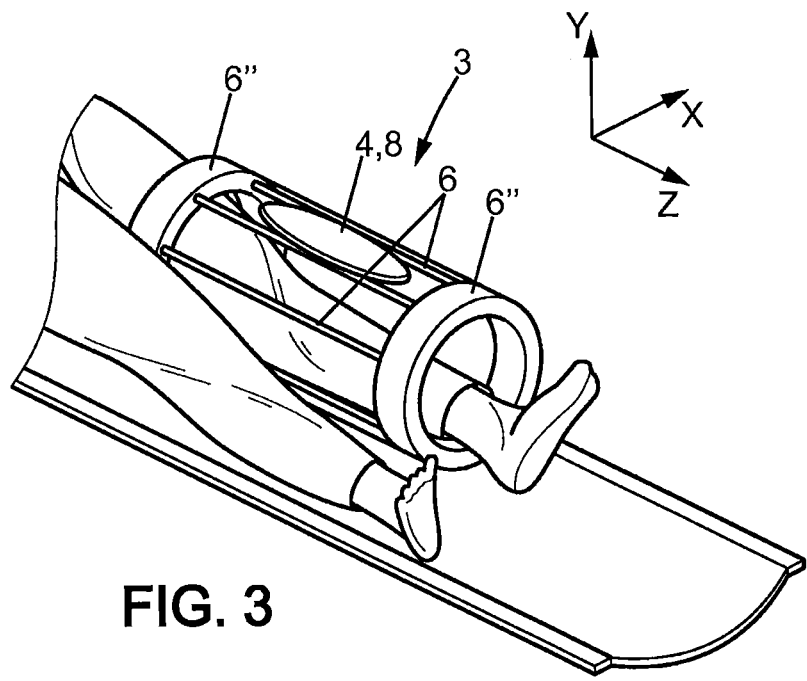
FIG. 3 shows the radio-frequency antenna system of the imaging device of FIG. 1.

The radio-frequency transmitter 4 and/or receiver 8 may, for example, be a single magnetic antenna as represented in FIG. 3. Such a magnetic antenna may be, for example, a loop of axis y, contained in plane (x,z). This loop generates a radio-frequency magnetic field B1 along its y axis, and which decreases for example by 1/r. The diameter of the loop may be, for example, about 3.5 cm for a 7 T MRI device for animals. The diameter of the loop is about 20 cm to 30 cm for a 7 T MRI device for humans. The fields required for NMR are lower.

The radio-frequency antenna system 3, as represented for example in FIG. 3, also comprises a system of electromagnetic resonators. The system of resonators comprises a set of electromagnetic resonators, each resonator being denoted 6. The resonators 6 are adjacent, and are mechanically secured to a support but are not mechanically secured to each other and are not electrically connected to each other. The system of electromagnetic resonators is also not secured to the radio-frequency transmitter 4 and/or receiver 8. In one particular embodiment, the electromagnetic resonators 6 are mechanically connected on each side of the resonant enclosure, to rings 6" as shown in FIG. 3.

In one embodiment, the system of resonators 6 is excited by the radio-frequency transmitter 4, which may be a single magnetic antenna. The radio-frequency waves emitted by the system may, for example, be received by the radio-frequency receiver 8 in the case where the radio-frequency antenna system is used for transmission and reception. The radio-frequency antenna system may be used only for transmission or for reception, the reception or transmission respectively being provided by another device such as a "birdcage" for example. In one particular embodiment, the radio-frequency receiver 8 may for example be a magnetic antenna that is in plane (x,z) and the resonant rods, which act as electromagnetic resonators each denoted 6, may be parallel to the z axis.

The electromagnetic resonators 6 are electrically insulated from each other and from the radio-frequency transmitter 4 and/or receiver 8. The radio-frequency transmitter 4 and/or receiver 8 can be fixed for example, and the system of resonators 6 can be moved to select the region to be imaged, so as to image a region which is not facing the antenna for example.

The electromagnetic resonators 6 are mutually hybridized. For N hybridized electromagnetic resonators 6, the system of resonators is described by N hybrid modes. The frequency at which only the resonator concerned resonates can be denoted $\omega$. Each hybridized mode has its own frequency and corresponds to an arrangement specific to the lines of the radio-frequency magnetic field B1. These hybridized modes are accompanied by an enhancement of the radio-frequency magnetic field B1, which improves the signal-to-noise ratio. Of the N modes, not all correspond to constructive magnetic fields within the enclosure defined by the system of resonators. One or more of these hybrid modes, corresponding to a mapping of the magnetic field lines, may be excited selectively. For a nuclear magnetic resonance device used at frequency $\omega 0$, we denote as $\omega'$ the resonance frequency of the hybridized mode having its frequency closest to $\omega 0$. As described below, the system of resonators 6 may be modified geometrically so that $\omega'$ is brought closer to $\omega 0$, the working frequency of the nuclear magnetic resonance device.

The electromagnetic resonators 6 may be, for example, resonators that have at least one resonance primarily excited by the electric field, such as parallel straight conductive metal rods. Such resonators will be referred to as electrical resonators in the rest of the description. The rods may be, for example, covered with an insulating material. The electrical resonators 6, which are of non-magnetic material, may be for example of non-ferrous material such as pure copper, brass, or aluminum.

An electrical resonator 6 may be for example a rod which resonates at around $\omega 0/2$. The electrical resonator 6 in this case is of a size comparable to a half-wavelength. The number of electrical resonators 6 is variable.

Figure 4:
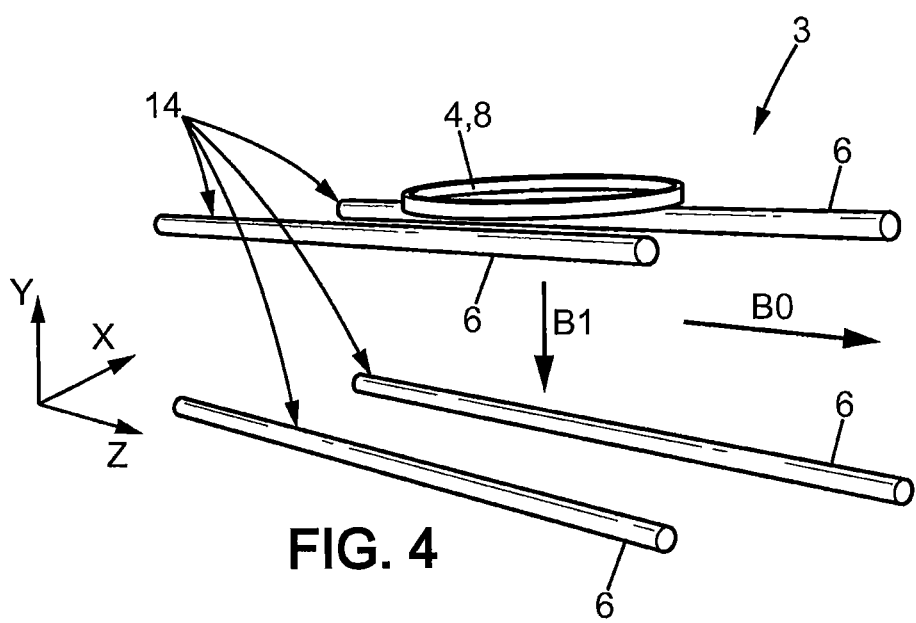
FIG. 4 shows a variant of the radio-frequency antenna system in the case of a four-resonator resonant system, FIGS. 5 a, b, c, d are diagrams of four hybridized modes, in the case of the antenna system of FIG. 4, FIGS. 6a and b model the directions of the radio-frequency magnetic field for two different hybridized modes, in the case of the antenna system of FIG. 4.
Figure 5A:
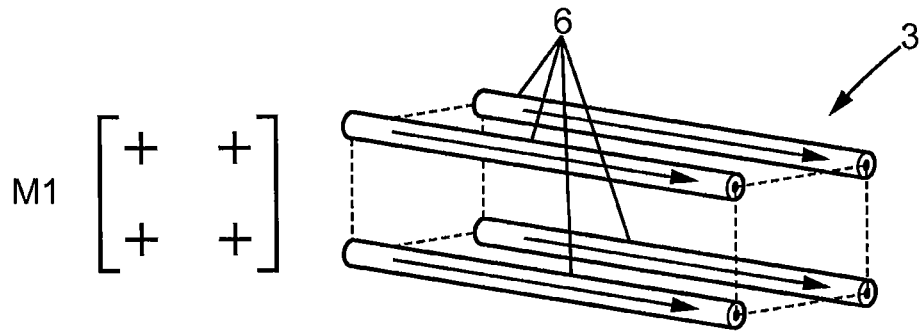
Figure 5B:
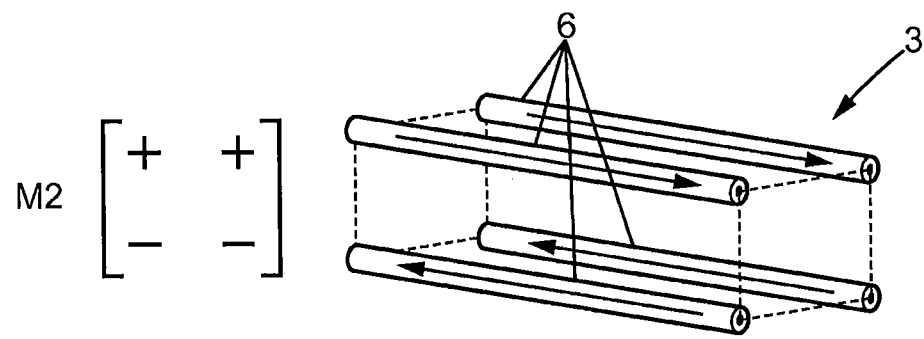
Figure 5C:
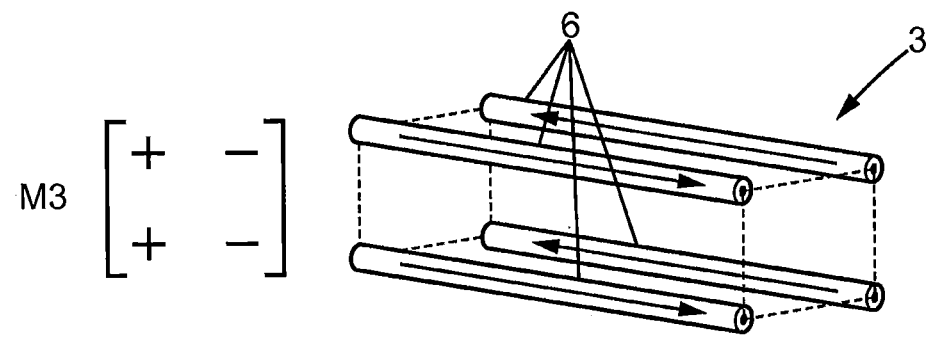
Figure 5D:
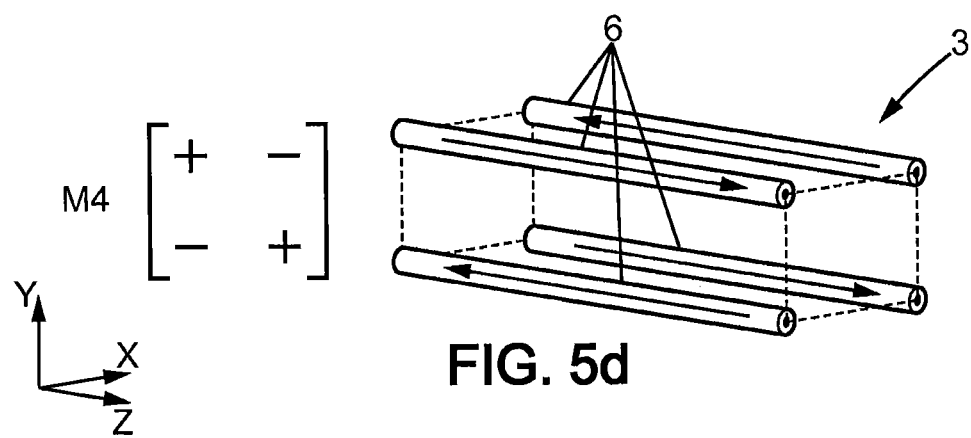

In one particular embodiment, four electrically resonant rods 6 may be hybridized as shown in FIG. 4. The resonant system with its four rods 14 can be described by four hybridized modes, with four different resonance frequencies $\omega$. The four resonant rods 6 may be, for example, arranged circularly about an axis parallel to z.

If the radio-frequency transmitter 4 is a loop in plane (x,z), the resonant rods 6 are relatively close to the loop to allow the system to operate properly, meaning so that the resonant system 14 properly catches the lines of the radio-frequency magnetic field B1 emitted from the loop. The distance along the z axis between the resonant rods 6 of the loop may be, for example, on the order of the loop radius. The distance between the resonant rods is variable. The distance between the resonant rods may be, for example, on the order of the loop diameter. These dimensions are for illustration only, and may vary in other embodiments.

The resonators 6 may be, for example, separated by a distance between $\lambda'/30$ and $\lambda'/3$, with $\lambda'$ being the wavelength associated with the pulse $\omega'$ said hybridized mode frequency close to $\omega 0$.

The electrically resonant rods 6 are traveled by currents which can be parallel or antiparallel for two adjacent resonant rods 6: there is a phenomenon of electromagnetic coupling between the four resonant rods 6. Each rod can be likened to a dipole, and two adjacent dipoles are hybridized symmetrically or anti-symmetrically. Each hybrid mode of the four-rod resonant system 14 corresponds to a particular configuration of the directions of the current in each of the four electromagnetic resonators 6, as represented in FIG. 5.

The four-rod resonant system 14 can then be described by four hybrid modes. The radio-frequency magnetic field created by the loop and parallel to y is enhanced by excitation of one of these modes of the four-rod resonant system 14: the spatial distribution of the radio-frequency magnetic field B1 emitted by the radio-frequency transmitter 4 is modified.

Figure 6A:
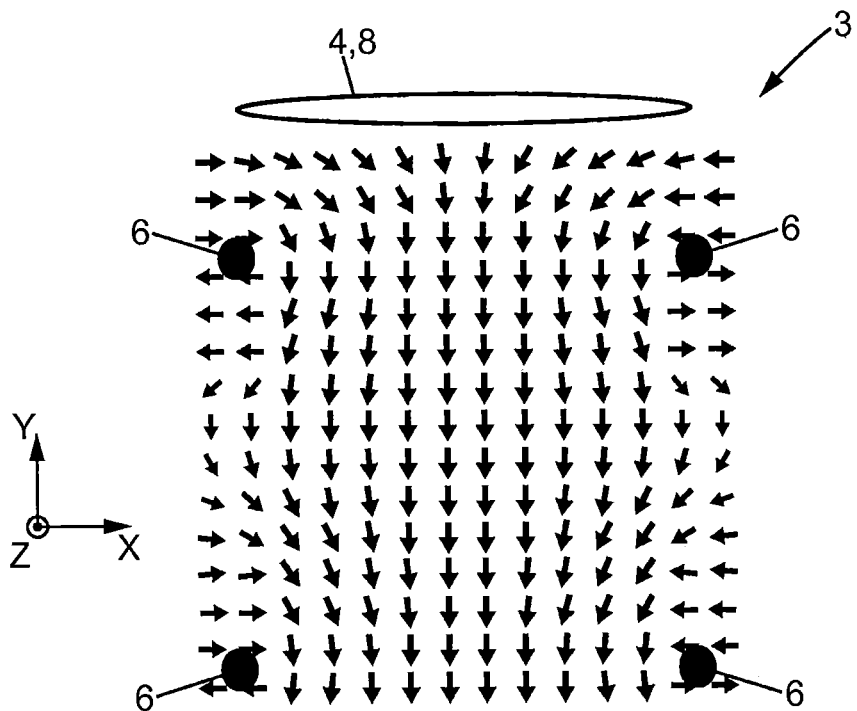
Figure 6B:
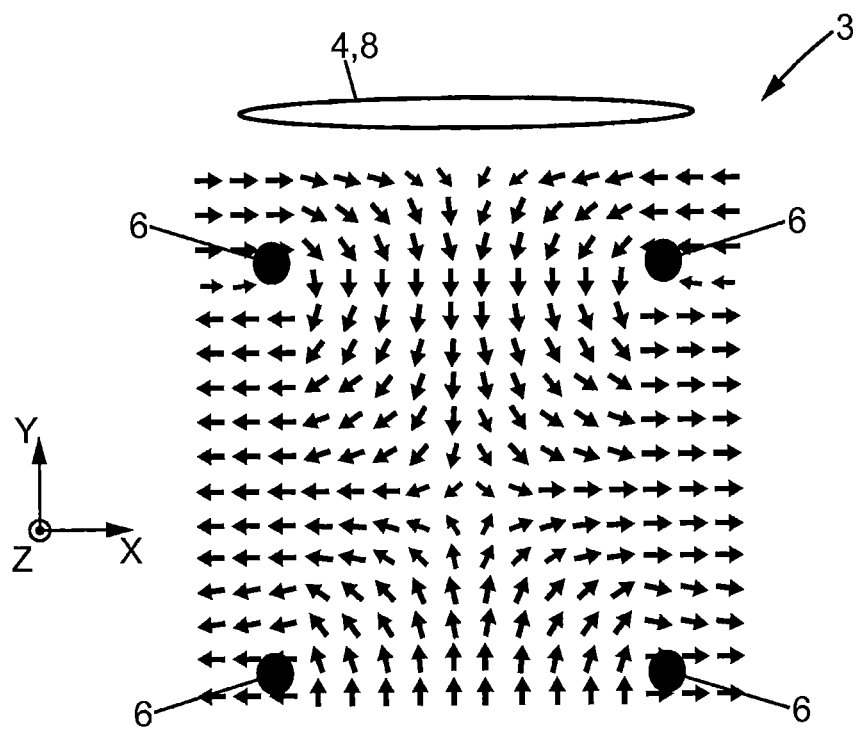
Figure 7:
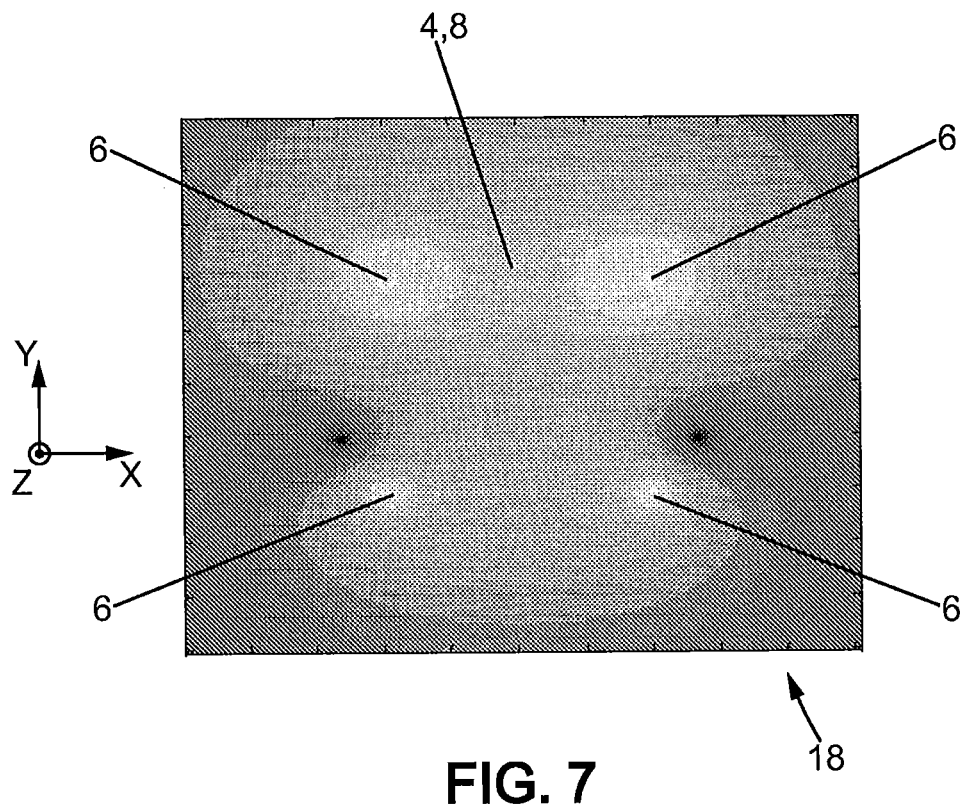
FIG. 7 shows the mapping of the magnetic field within the radio-frequency antenna system of FIG. 4, FIGS. 8a and b are MRI images respectively captured with and without resonators in the transmitter and/or receiver depicted in FIG. 4.

Among these four hybrid modes, the modes corresponding to constructive interference for the radio-frequency magnetic field B1 may be selected for example. Specifically in the case of a four-rod resonant system 14, the obtained hybrid modes M1 and M2 do not respect the symmetry of the resonant system 14. Hybrid modes M2 and M3 generate a homogeneous radio-frequency magnetic field at the center of the four-rod resonant system 14. Due to the symmetry, these two modes resonate at the same frequency. The fourth hybrid mode M4 corresponds to destructive interference which gives a radio-frequency magnetic field B1 that is zero at the center. As the horizontal symmetry of the resonant system 14 is broken by the loop of axis y, only hybrid modes M3 and M4 are excitable. FIG. 6 shows the distribution of the radio-frequency magnetic field (the radio-frequency magnetic field is represented by an arrow) inside the enclosure of the resonant system 14. If only hybrid mode M3 is for example excited, this mode has an axial symmetry around the axis parallel to the y of the loop, which results in constructive interference at the center of the resonant system 14. The excited mode of the resonant system 14 then interferes with mapping the radio-frequency magnetic field B1 emitted by the loop, and the radio-frequency magnetic field B1 inside the enclosure of the resonant system 14 has a volume distribution around y and is more or less uniform as shown in FIG. 6. FIG. 7 shows the mapping of the magnetic field B1 for a radio-frequency antenna system 3 in the particular case of this embodiment having one loop serving as radio-frequency transmitter and/or receiver of axis y.

The excitation of hybridized modes is correlated to the distance between the radio-frequency transmitter 4 and/or receiver 8 and the system of resonators. The hybridized modes are also correlated to the size of the radio-frequency transmitter 4 and/or receiver 8. In the case of the four-rod resonant system 14, the resonators 6 are spaced apart so as to free up a large imaging region. The distance between the two planes containing the pairs of resonant rods 6 and parallel to plane (x,z) is short so as to obtain a magnetic field B1 on the resonant rods 6 of the lower level that is of sufficient amplitude to allow a phenomenon of enhancing the magnetic field B1 in that region. For a 7 T animal MRI for example, the distance between adjacent resonant rods 6 is about 2.5 cm for example.

In application, as mentioned above, the radio-frequency antenna system is often favored for reception while transmission can be provided by a birdcage, particularly for the provided advantages in reception gain when using the radio-frequency antenna system. In one particular embodiment, the transmitter 4 is a birdcage and the reception uses a radio-frequency antenna system comprising a set of resonators 6 and a radio-frequency receiver 8. The radio-frequency receiver 8 receives radio-frequency magnetic field waves captured inside the enclosure defined by the resonator system, at frequency ω0. For this embodiment, the radio-frequency magnetic receiver 8 may be, for example, a simple magnetic antenna.

Alternatively, the receiver may be any of those mentioned above, for example.

In another embodiment, the radio-frequency magnetic receiver 8 may be, for example, identical to the radio-frequency transmitter 4.

When using a nuclear magnetic resonance device 0, the Larmor frequency of the nucleus to be imaged is known in principle. Generally the hydrogen nucleus (proton) is imaged, although other nuclei may be used. It may therefore be of interest in MRI and be necessary in NMR to be able to adjust the resonance frequency of the nuclear magnetic resonance device to the Larmor frequencies of the nuclei of the structure to be imaged, a resonance frequency that can change according to which fields the nuclear magnetic resonance device is working with.

The frequency of the hybridized modes of the resonators 6 is likely to be different depending on the load placed inside the enclosure defined by the system of resonators. It may therefore be necessary to be able to make adjustments to the frequency of the hybridized resonators 6.

The desire to be able to detect other elements related to other Larmor frequencies ω is also a key argument for making improvements to current nuclear magnetic resonance devices.

The radio-frequency antenna system 3 excites the magnetic moments of the nuclei according to the principle of nuclear magnetic resonance, at the frequency where the radio-frequency antenna system 3 must resonate in order to cause resonance of the magnetic moments of the nuclei to be imaged. The system of resonators is designed so that its dimensions that allow obtaining a constructive field hybridized mode at the Larmor frequency.

Figure 8A:
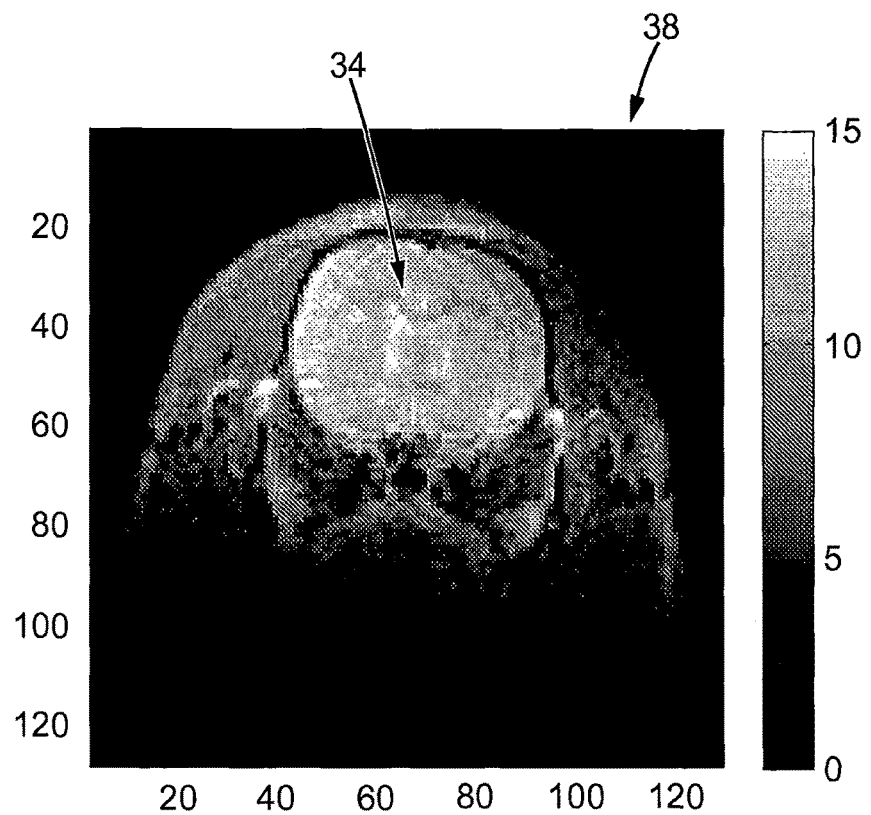
Figure 8B:
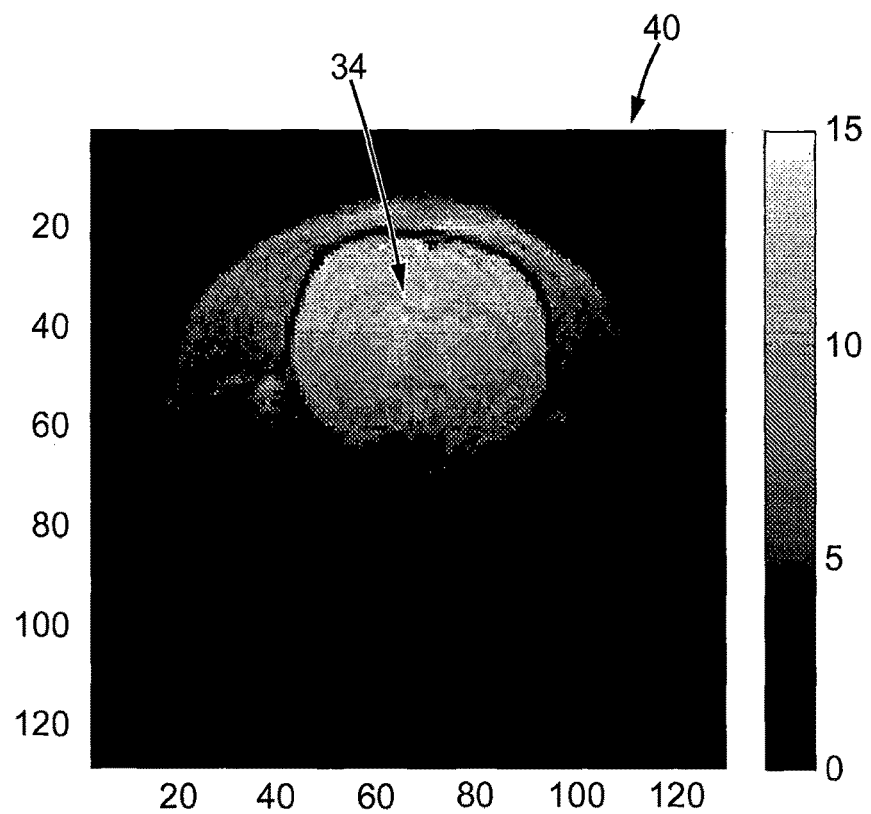

Through the use of resonant systems, the signal-to-noise ratio of the nuclear magnetic resonance device is increased for example by at least 100%, and an increase of the penetration depth and of the area imaged longitudinally are observed in comparison to existing MRI devices. The performance of the system described in the invention is highlighted in FIG. 8. FIG. 8a is an MRI image 38 of the region to be imaged 34 in a rat head 16, captured when the radio-frequency antenna system 3 of the MRI device does not comprise a system of resonators. FIG. 8b is an MRI image 40 of the region to be imaged 34 in a subject 16, captured when the radio-frequency antenna system 3 of the MRI device comprises a system of resonators.

Figure 9:
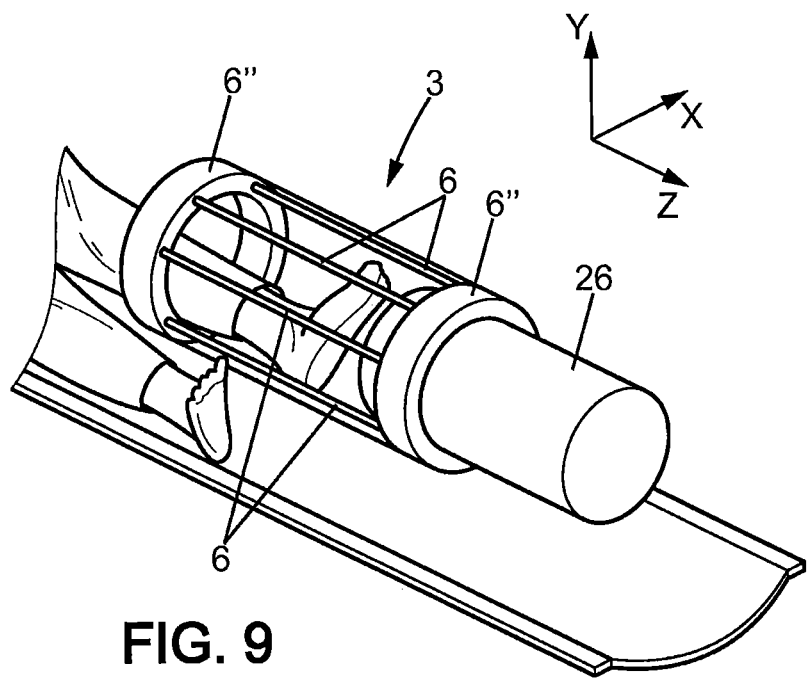
FIG. 9 is a diagram of a radio-frequency antenna system with a dielectric, in one variant of the invention.

In one particular embodiment, the resonance frequency of the system defined by the set of resonators 6 can be adjusted mechanically by varying the length of the electromagnetic resonator 6. An internal device for adjusting the length of the rods may be integrated into the system for example. It may be a motor for changing the length of the rods which for example are telescoping. In another embodiment, the resonance frequency of the system of resonators may be adjusted mechanically by integrating a solid dielectric element 26 of high index such as plexiglas (index greater than 4), as shown in FIG. 9. Alternatively, the resonance frequency of the system of resonators may be adjusted mechanically by changing the relative positions of the electromagnetic resonators 6.

The resonance frequency of the system defined by the set of resonators 6 may also be adjusted electrically, by using passive elements such as capacitors.

For example, it is necessary to be able to tune and detune the resonator system 6 easily, in the case where the transmission 4 and reception 8 antennas are different for example, so as not to induce a signal in the receiving antenna during transmission.

Alternatively, several nuclei with different resonance frequencies can be imaged during the same manipulation, either successively by adjusting the frequency of the resonator system to the frequency of the nucleus to be imaged, or simultaneously by having two hybrid modes coexist at two different resonance frequencies within the enclosure of the radio-frequency antenna system 3.

Figure 10:
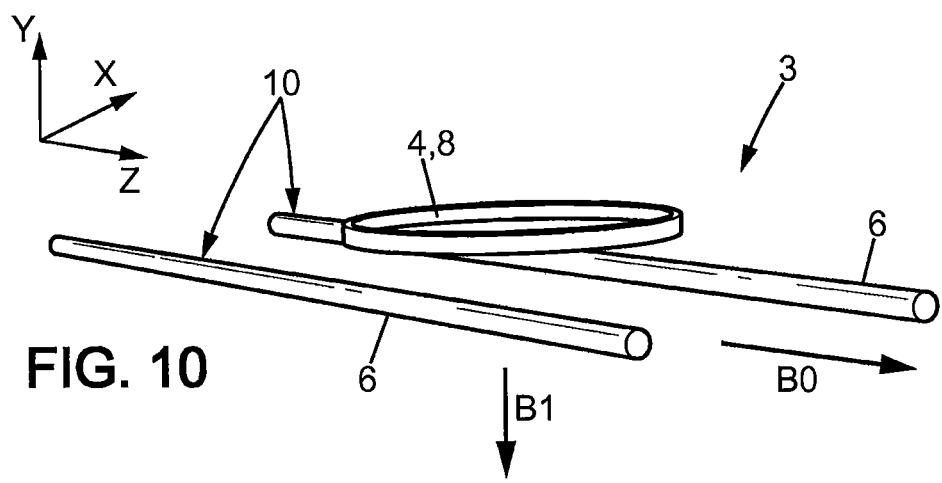
FIG. 10 shows another variant of the radio-frequency antenna system, comprising two resonators.

In one particular embodiment, only two resonant rods may be hybridized instead of four, as shown in FIG. 10. The two-rod resonant system 10 may be excited by a radio-frequency transmitter 4 and/or receiver 8 which may be a loop contained in plane (x,z). The two resonant rods 6 are traveled by currents in the same direction or in opposite directions. The two-rod resonant system 10 can then be described by two hybrid modes.

In another particular embodiment, the radio-frequency transmitter 4 and/or receiver 8 may be an electric dipole, not adapted, of axis z. Alternatively, the radio-frequency transmitter 4 and/or receiver 8 may be a set of magnetic antennas in order to obtain a more homogeneous magnetic field. For example, these may be two magnetic antennas placed in quadrate, such as two loops arranged in planes (x,z) and (y,z). The magnetic field B1 then rotates at the Larmor frequency in plane (x,y). If the four-rod resonant system 14 is excited by a radio-frequency transmitter 4 comprising two loops placed in quadrate, the hybrid modes M2 and M3 of the same resonance frequency can be excited simultaneously. This solution provides a response to the acquisition speed and performance issues of the MRI device 0.

In another variant, the set of magnetic antennas may comprise two loops contained in planes parallel to plane (x,z), one on either side of plane (x,z). The amplitude of the magnetic field B1 can then for example be increased.

In one particular embodiment, the number of electromagnetic resonators 6 is N>4. Additional zeros in the magnetic field B1 appear in the mapping of the magnetic field B1. Alternatively, the resonator 6 may be a metal rod having the shape for example of a loop or rectangle, or coil.

Figure 11:
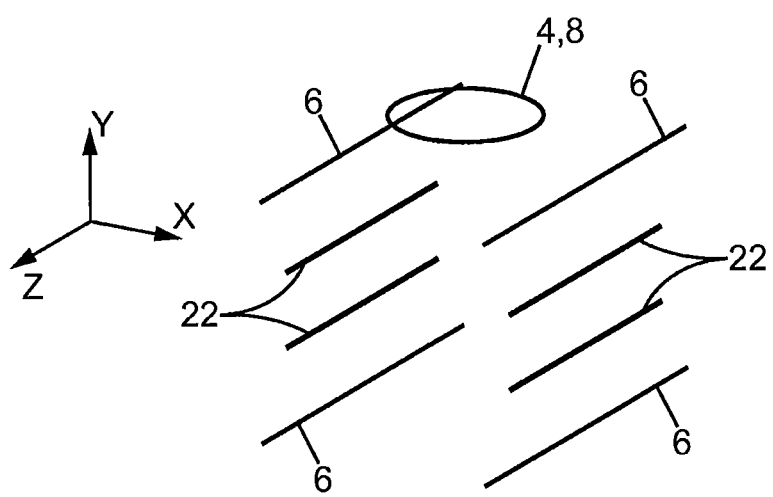
FIG. 11 is a diagram of the radio-frequency antenna system in an embodiment comprising four resonators including non-resonant elements.

Alternatively, other non-resonant elements may be introduced into the resonator system, in order to expand and improve the three-dimensional homogeneity of the magnetic field B1 inside the enclosure of the resonator system. In the particular case of a four-rod resonant system 14, additional shorter rods 22, also parallel to z, are added to the resonant system 14 as represented in FIG. 11. They are traveled by currents which interfere with the mapping B1 of the magnetic field within the radio-frequency antenna system 3 by carrying the magnetic field B1 further along y, but without the rods 22 introduced here participating in the hybridization phenomenon of the resonant system 14. The magnetic field B1 is homogeneous over a fairly large region at the center of the four-rod resonant system 14 for the constructive magnetic field hybrid mode.

The radio-frequency magnetic receiver 8 may be identical to or different from the radio-frequency transmitter 4.

When the region to be imaged 34 becomes large, in the case of a human 7 T for example, the variations in the magnetic field B1 within the region to be imaged 34 are no longer negligible. There are numerous zeros of the magnetic field B1 in this region 34. In one particular embodiment, several hybrid modes of the resonator system can be excited at the same time or in succession, by electrical or mechanical adjustment, and the resulting images for each mode are sliced. For example, in the case of the four-rod resonant system 14, hybrid modes M3 and M4 are excited at the same time. Mapping the field of the hybrid mode M4 shows a zero magnetic field at the center. By changing the length of the bottom two resonant rods, the zero magnetic field B1 is moved and the images obtained for these two known hybrid modes are sliced in order to increase the definition. Alternatively, the images obtained for the different hybrid modes can be interpreted in light of the mapping of the magnetic fields B1 of each of the hybrid modes, their areas of homogeneity, and their magnetic field nodes. Alternatively, the images may be obtained by working with several mapped hybrid modes, which together give a homogeneous magnetic field B1. In one particular embodiment using a set of magnetic antennas as radio-frequency transmitter 4, the multichannel network sends different radio-frequency pulses on each channel so that the magnetic field B1 emitted by the set of magnetic antennas gives a flip angle that is homogeneous overall. The magnetic field B1 is then treated as a homogeneous magnetic field in the region to be imaged 34. Alternatively, different images can be obtained in succession by moving the object to be imaged relative to the mapping of the magnetic field B1 of the resonator system for the hybrid mode selected, and then the overall image is obtained by summing these images in proportion to their contributions.

The invention claimed is:

1. A radio-frequency antenna system comprising a least one radio-frequency transmitter and/or receiver connected to a transmission and/or reception control device adapted to cause said radio-frequency antenna system to transmit and/or receive radio-frequency waves at a radio frequency $\omega 0$ within 'a given volume, and mutually hybridized resonators having a resonance frequency $\omega'$ close to $\omega 0$, wherein said resonators are mutually hybridized electro-magnetically, are coupled to the radio-frequency transmitter and/or receiver, and are electrically insulated from one another and from the radio-frequency transmitter and/or receiver, wherein the electric resonators are parallel resonant rods arranged around the given volume and made of a non-magnetic material that is electrically conductive.

2. The system according to claim 1, wherein the resonators are N in number and have N hybridized mode, the radio-frequency antenna system further comprising mode excitation for selectively exciting said hybridized modes.

3. The system according to claim 1, wherein said mode excitation means are adapted to excite a plurality of hybridized mode simultaneously.

4. The system according to claim 1, wherein the resonators comprise resonators that have at least one resonance primarily excited by the electric field.

5. The system according to claim 1, wherein the distance between the resonators is between $\lambda'/30$; and $\lambda'/3$ where $\lambda'$ is the wavelength associated with the pulse $\omega'$.

6. The system according to claim 1, wherein the resonant rods are arranged at an equal distance from a central axis.

7. The system according to claim 1, wherein the radio-frequency transmitter and/or receiver comprises a radio-frequency antenna chosen from among a non-adapted electric dipole and a loop.

8. The system according to claim 1, wherein the radio-frequency transmitter and/or receiver comprises a plurality of radio-frequency antennas.

9. The system according to claim 1, further comprising a solid dielectric element of high index placed at least partially between the resonators.

10. The system according to claim 1, further comprising at least one device for moving the resonators relative to one another, the frequency of the hybridized modes being a function of the relative positions of said resonators.

11. The system according to claim 1, wherein the resonant rods have an adjustable length, further comprising at least one internal device for adjusting the length of the rods, the resonance frequency of the resonant rods being a function of said length.

12. A nuclear magnetic resonance device comprising at least:
an electromagnet adapted to generate a permanent magnetic field,
a radio-frequency antenna system according to claim 1, adapted to generate a radio-frequency magnetic field having at least one component transverse to the permanent magnetic field.

13. The device according to claim 12, wherein the permanent magnetic field is greater than or equal to 3 T.

14. The device according to claim 12, further comprising at least one non-resonant passive conductive member adapted to render the radio-frequency magnetic field more homogeneous.

15. The nuclear magnetic resonance device according to claim 12, further comprising a coil system adapted to create magnetic field gradients in addition to the permanent magnetic field.

\* \* \* \* \*